US012777585B2

(12) United States Patent
Kim et al.

(10) Patent No.: US 12,777,585 B2

(45) Date of Patent: Oct. 27, 2026

(54) METHOD FOR MANUFACTURING LASER-INDUCED GRAPHENE BASED E-TEXTILE AND LASER SYSTEM IMPLEMENTING THE METHOD

(71) Applicant: KOREA ADVANCED INSTITUTE OF SCIENCE AND TECHNOLOGY, Daejeon (KR)

(72) Inventors: Young-Jin Kim, Daejeon (KR); Dongwook Yang, Daejeon (KR); Han Ku Nam, Daejeon (KR); Younggeun Lee, Daejeon (KR); Youngryeul Kim, Daejeon (KR); Le Dinh Truong Son, Daejeon (KR); Seung-Woo Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 243 days.

(21) Appl. No.: 18/530,627

(22) Filed: Dec. 6, 2023

(65) Prior Publication Data

US 2024/0196527 A1 Jun. 13, 2024

(30) Foreign Application Priority Data

Dec. 13, 2022 (KR) ........................ 10-2022-0174202
Apr. 27, 2023 (KR) ........................ 10-2023-0055300

(51) Int. Cl.

| | |
|---|---|
| ***H05K 1/03*** | (2006.01) |
| ***D03D 1/00*** | (2006.01) |
| ***D06M 10/00*** | (2006.01) |

(52) U.S. Cl.

CPC ........... *H05K 1/038* (2013.01); *D03D 1/0088* (2013.01); *D06M 10/005* (2013.01); *H05K 2201/0281* (2013.01); *H05K 2201/029* (2013.01); *H05K 2203/108* (2013.01)

(58) Field of Classification Search

CPC ........... H05K 1/038; H05K 2201/0281; H05K 2201/029; H05K 2203/108; D03D 1/0088; D06M 10/005

See application file for complete search history.

(56) References Cited

U.S. PATENT DOCUMENTS

2018/0039117 A1 * 2/2018 Ikeda ................ G02F 1/133526

FOREIGN PATENT DOCUMENTS

WO WO-2020237296 A1 * 12/2020 ............. H05K 3/106

OTHER PUBLICATIONS

Young-Jin Kim et al., "Direct-laser-conversion of Kevlar textile to laser-induced-graphene for realizing fast and flexible fabric strain sensors", CIRP Annals-Manufacturing Technology. 71, pp. 473-476 (Available online May 19, 2022), total 4 pages.

Huimin Wang et al., "Laser Writing of Janus Graphene/Kevlar Textile for Intelligent Protective Clothing". ACS Nano 2020, 14, pp. 3219-3226, Published: Feb. 21, 2020, total 6 pages.

* cited by examiner

*Primary Examiner* — Jeremy C Norris

(74) *Attorney, Agent, or Firm* — LEX IP MEISTER, PLLC

(57) ABSTRACT

A laser system includes a femtosecond laser; and a scanner configured to irradiate laser beams, which are outputted from the femtosecond laser on fabric, according to a graphene pattern. An electronic textile with graphene patterned on the fabric is manufactured by the laser beams. The graphene pattern and a structure of the fabric are differently determined depending on applications of the electronic textile.

18 Claims, 11 Drawing Sheets

METHOD FOR MANUFACTURING LASER-INDUCED GRAPHENE BASED E-TEXTILE AND LASER SYSTEM IMPLEMENTING THE METHOD

CROSS-REFERENCE TO RELATED APPLICATION

This application claims priority to and the benefit of Korean Patent Application No. 10-2022-0174202 filed in the Korean Intellectual Property Office on Dec. 13, 2022, and Korean Patent Application No. 10-2023-0055300 filed in the Korean Intellectual Property Office on Apr. 27, 2023, the entire contents of which are incorporated herein by reference.

BACKGROUND

(a) Field

The present disclosure relates to laser-induced graphene (LIG).

(b) Description of the Related Art

Electronic textiles (E-textiles) configured by synthesizing electric and information functions is made by weaving conductive fibers and installing functional components on the textiles. The electronic textile is excellent in flexibility and adaptability. Therefore, the electronic textiles are expected to be utilized for personal wearable devices required in various fields such as healthcare, sports, firefighting, and military.

Recently, research has been conducted on large-area display textiles, woven textile lithium-ion fiber batteries, and multifunctional electronic textiles. However, the current method of manufacturing the electronic textile by weaving long conductive yarns requires a large amount of time, the conductive yarn is gradually damaged and cut, and it may be difficult to electrically integrate functional components with the electronic textile. As described above, because the process of manufacturing the electronic textile is complicated and has low design flexibility, the process of manufacturing the electronic textile is not suitable for the mass production. Therefore, simpler design and patterning strategies are required for wider applications of the electronic textiles.

SUMMARY

The present disclosure attempts to provide a method of manufacturing a laser-induced graphene-based electronic textile and a laser system for implementing the same.

The present disclosure also attempts to provide a wearable textile device made by applying a laser-induced graphene-based electronic textile.

A laser system according to one embodiment includes: a femtosecond laser; and a scanner configured to irradiate laser beams, which are outputted from the femtosecond laser on fabric, according to a graphene pattern. An electronic textile with graphene patterned on the fabric is manufactured by the laser beams.

The graphene pattern and a structure of the fabric may be differently determined depending on applications of the electronic textile.

The fabric may be a non-woven fabric when the application of the electronic textile is an energy storage device.

The fabric may be a non-woven fabric when the application of the electronic textile is a temperature sensor.

The fabric may be a knit fabric when the application of the electronic textile is a strain sensor.

The graphene may be patterned on the knit fabric in a pre-strain state in which the knit fabric is stretched within a predetermined range.

The fabric may be a woven fabric when the application of the electronic textile is a bending sensor.

The bending sensor may be used as a voice recognition sensor that distinguishes between voices by detecting voice vibration by means of a woven structure including weft and warp of the woven fabric.

A method of manufacturing a laser-induced graphene-based electronic textile according to another embodiment includes: receiving a graphene pattern; and manufacturing an electronic textile with patterned graphene by irradiating directly laser beams of a femtosecond laser on a fabric according to a graphene pattern by using a computer-programmable scanner.

The graphene pattern and a structure of the fabric may be differently determined depending on applications of the electronic textile.

The manufacturing the electronic textile may comprise manufacturing an energy storage device by irradiating directly the laser beams on a non-woven fabric when the application of the electronic textile is the energy storage device.

The manufacturing the electronic textile may comprise manufacturing a temperature sensor by irradiating directly the laser beams on a non-woven fabric when the application of the electronic textile is the temperature sensor.

The manufacturing the electronic textile may comprise manufacturing a strain sensor by irradiating directly the laser beams on a knit fabric when the application of the electronic textile is the strain sensor.

The manufacturing the electronic textile may comprise patterning graphene by irradiating directly the laser beams on the knit fabric in a pre-strain state in which the knit fabric is stretched within a predetermined range.

The manufacturing the electronic textile may comprise manufacturing a bending sensor by irradiating directly the laser beams on a woven fabric when the application of the electronic textile is the bending sensor.

The bending sensor may be used as a voice recognition sensor that distinguishes between voices by detecting voice vibration by means of a woven structure including weft and warp of the woven fabric.

According to the embodiment, it is possible to manufacture the laser-induced graphene-based electronic textile with high patterning resolution and a minimum machining depth in various fabric structures.

According to the embodiment, it is possible to manufacture the laser-induced graphene-based electronic textile that may be easily applied to general fabrics without requiring a fabric weaving process and have high electrical conductivity without a problem of potential degradation.

According to the embodiment, the wearable energy storage devices and various types of wearable sensors capable of performing temperature monitoring, motion detection, voice recognition, and the like may be made of the electronic textile, which may realize the wearable multimodal electronic textile.

DETAILED DESCRIPTION OF THE EMBODIMENTS

Figure 1:
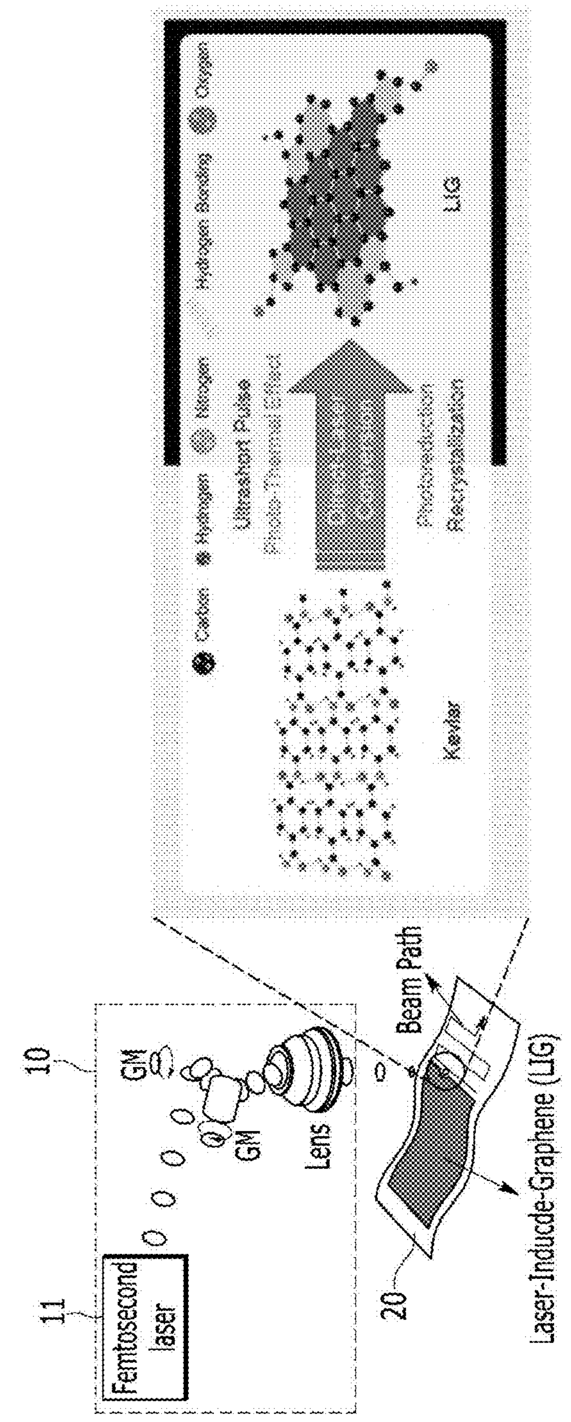
FIG. 1 is a view for explaining a method of converting fabrics into laser-induced graphene according to one embodiment.

Hereinafter, embodiments of the present disclosure will be described in detail with reference to the accompanying drawings so that those with ordinary skill in the art to which the present disclosure pertains may easily carry out the embodiments. However, the present disclosure may be implemented in various different ways and is not limited to the embodiments described herein. Further, a part irrelevant to the description will be omitted in the drawings in order to clearly describe the present disclosure, and similar constituent elements will be designated by similar reference numerals throughout the specification.

In the description, unless explicitly described to the contrary, the word "comprise/include" and variations such as "comprises/includes" or "comprising/including" will be understood to imply the inclusion of stated elements, not the exclusion of any other elements.

In the description, reference numerals and names are designated for convenience of description, and devices are not necessarily limited to the reference numeral or name.

Graphene is a carbon allotrope including a single layer of carbon atoms with a honeycomb lattice shape and characterized by a large surface area, high physical/chemical stability, and excellent charge carrier mobility. Various graphene synthesis technologies, such as chemical vapor deposition (CVD), have been presented so far, but these technologies are not suitable for mass production because of limitations in costs, quality, expandability, yield, and productivity. Recently, laser direct-writing (LDW) technologies have been studied.

Graphene oxide, polyimide, wood, and the like are used as carbon precursors to be converted into LIG. Recently, textiles have attracted attention as new types of precursor materials. Among the textiles, Kevlar, which is a heat-resistant para-aramid synthetic fabric, is widely used in firefighting, military, and medical application fields. The Kevlar may be converted into LIG by using an infrared continuous-wave $CO_2$ laser. However, in case that the CO2 laser is used, the fabrics are deeply ablated by heat, which results in deterioration in patterning resolution, electrical conductivity, and stability and causes deformation. Therefore, it is difficult to apply the electronic textiles to various applications such as sensors. Next, a laser-induced graphene-based electronic textile, which is manufactured by using various fabrics, will be described.

Figure 2:
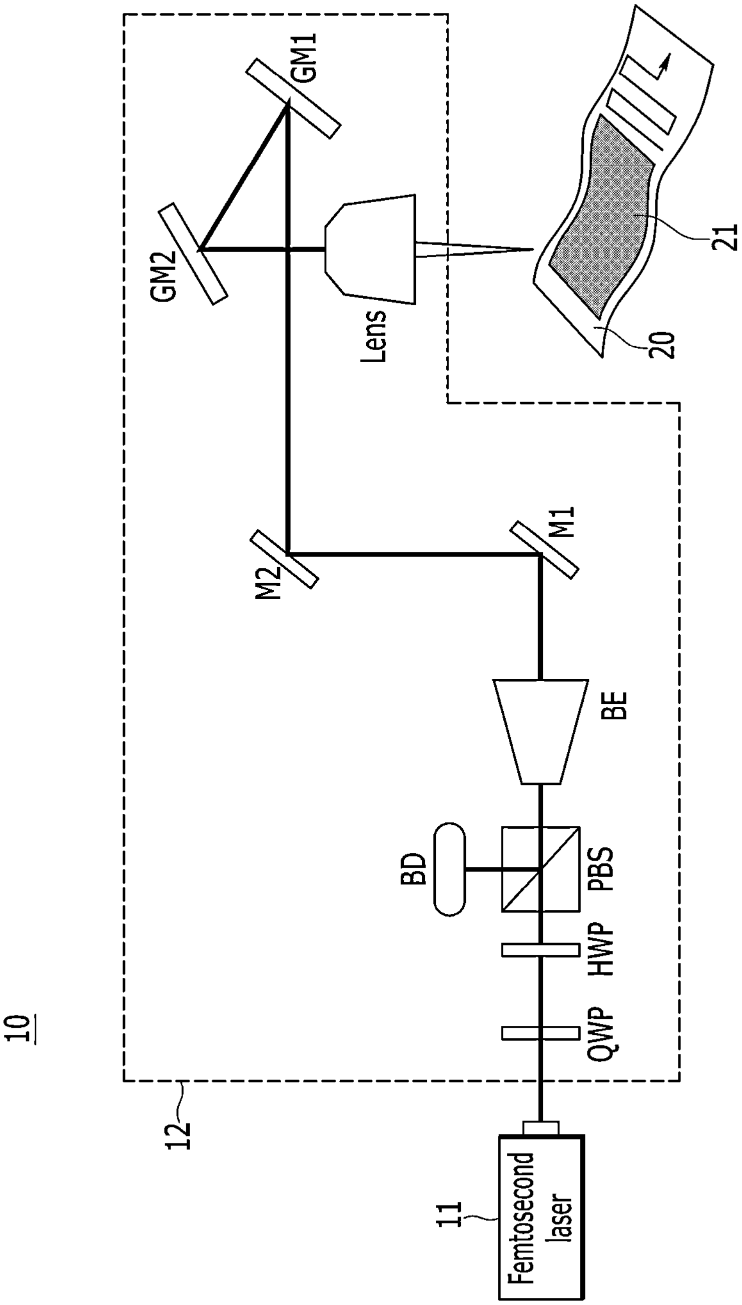
FIG. 2 is a configuration view of a laser system according to one embodiment.

FIG. 1 is a view for explaining a method of converting fabrics into laser-induced graphene according to one embodiment, and FIG. 2 is a configuration view of a laser system according to one embodiment.

Referring to FIG. 1, an electronic textile may be manufactured by a laser system 10 including a femtosecond laser 11. The electronic textile may be manufactured by patterning laser-induced graphene (LIG) directly on a fabric 20 based on laser direct-writing (LDW) using a femtosecond laser, and femtosecond laser beams may be scanned by a Galvano scanner including a Galvano mirror (GM). Therefore, the electronic textile may be simply and easily made by maskless patterning without a mask for LIG patterning.

When the fabric 20 is irradiated directly with an ultrashort pulse of the femtosecond laser 110, heat is accumulated in the fabric by a photo-thermal effect, in which photon energy is converted into thermal energy, as photons are absorbed by the fabric, and recrystallization, carbonization, and graphitization occur. In the description, Kevlar having heat resistance is used as an example of the fabric 20, but the fabric need not be limited to Kevlar.

Because the femtosecond laser 11 outputs pulse trains with a high repetition rate and an ultrashort pulse duration, the femtosecond laser 11 may provide a very high peak output by concentrating photon energy of the laser beams in a very short time. Therefore, even in a wavelength band in which light is not normally absorbed, the non-linearity of the interaction between the laser and materials is significant, and the multi-photon absorption phenomenon enables effective patterning, such that the laser may be used to process hard-to-process materials. In addition, because the pulse width of the femtosecond laser pulse is short, it is possible to minimize heat transfer to peripheral material and induce graphene by concentrating photon energy in a narrow region. That is, when the fabric is irradiated directly with the femtosecond laser pulse, it is possible to create high-quality graphene, in comparison with a continuous-wave laser, by lowering sheet resistance and reducing a line width while appropriately inhibiting an unexpected portion from being combusted by heat.

Referring to FIG. 2, the laser system 10 may include the femtosecond laser 11 and a scanner 12 configured to scan the laser beams. The scanner 12 may be a computer-programmable Galvano scanner. The scanner 12 scans the femtosecond laser beams in accordance with the graphene pattern and emits the femtosecond laser beams to the fabric 20. The scanner 12 may be variously implemented. For example, the scanner 12 may be implemented as optical components such as a quarter wave plate (QWP), a half wave plate (HWP), a polarized beam splitter (PBS), a mirror (M), a Galvano mirror (GM), and a scanning lens. The polarization of the laser beams outputted from the femtosecond laser 11 may be adjusted by the quarter wave plate, the half wave plate, and the polarized beam splitter and expanded by a beam expander (BE).

The LIG may be patterned on the fabrics with various structures such as a non-woven fabric, a knit fabric, and a woven fabric. A general fabric may be converted directly into an electronic textile by a simple cost-efficient method without a fabric weaving process. In addition, the laser direct-writing technology is more quickly and more easily accessible and makes it easier to control a carbon ratio in comparison with a technology such as chemical vapor deposition.

The electronic textile, which has been subjected to the LIG patterning process, may maintain high flexibility, adaptability, and air permeability of the fabric. In addition, it is possible to manufacture the electronic textile suitable for applications by selecting fabrics in consideration of inherent physical properties of the fabric structure. For example, an energy storage device or a temperature sensor may be made of an electronic textile with LIG patterned on a non-woven fabric less sensitive to external strain because of high mechanical strength and an intertwined structure. A human body motion detection sensor may be made of an electronic textile with LIG patterned on a knit fabric having a flexible structure. A voice recognition sensor may be made of an electronic textile with LIG patterned on a woven fabric having a woven structure in which weft and warp intersect.

When the laser system 10 patterns the LIG on the fabrics having various structures, the laser system 10 may be set in consideration of photon energy, wavelengths, material absorption, beam scanning speeds, and higher harmonic wave conversion efficiency together. For example, in case that infrared and ultraviolet femtosecond laser beams are emitted to Kevlar fabrics at a scanning speed within a range of 5 to 30 mm/s, average electric power lower than 1.5 W may be used for an infrared wavelength, and average electric power lower than 0.7 W may be used for an ultraviolet wavelength in consideration of third higher efficiency in generating harmonic waves. The sheet resistance of the LIG according to the fabric structure may be optimized at the average laser output and the average scanning speed.

Figure 3:
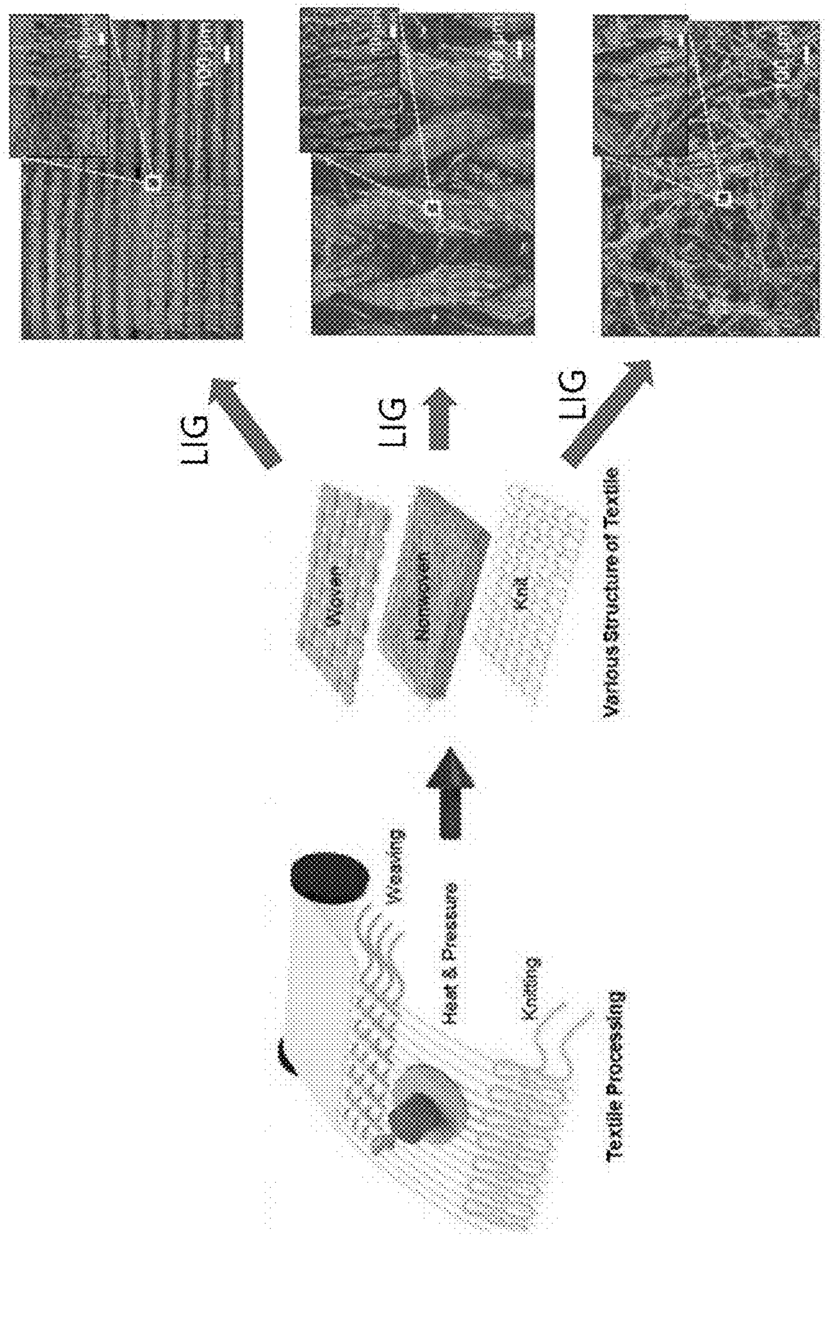
FIG. 3 is a view for explaining various fabric structures.
Figure 4:
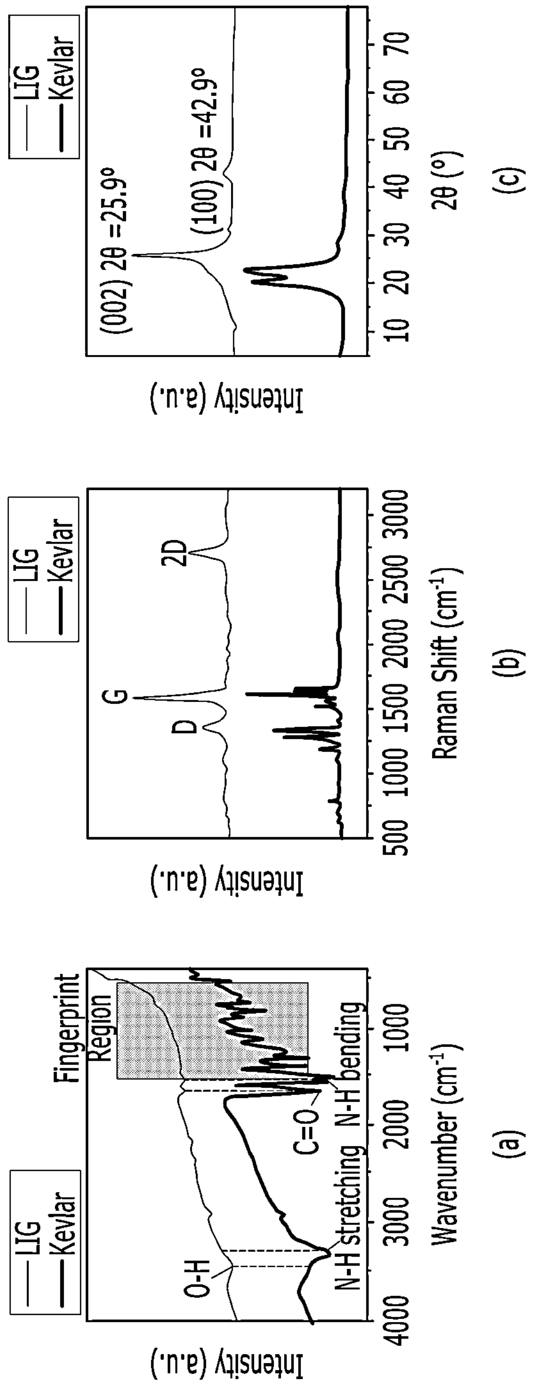
FIG. 4 is a view illustrating a result of analyzing properties of laser-induced graphene implemented in fabrics according to one embodiment.
Figure 5:
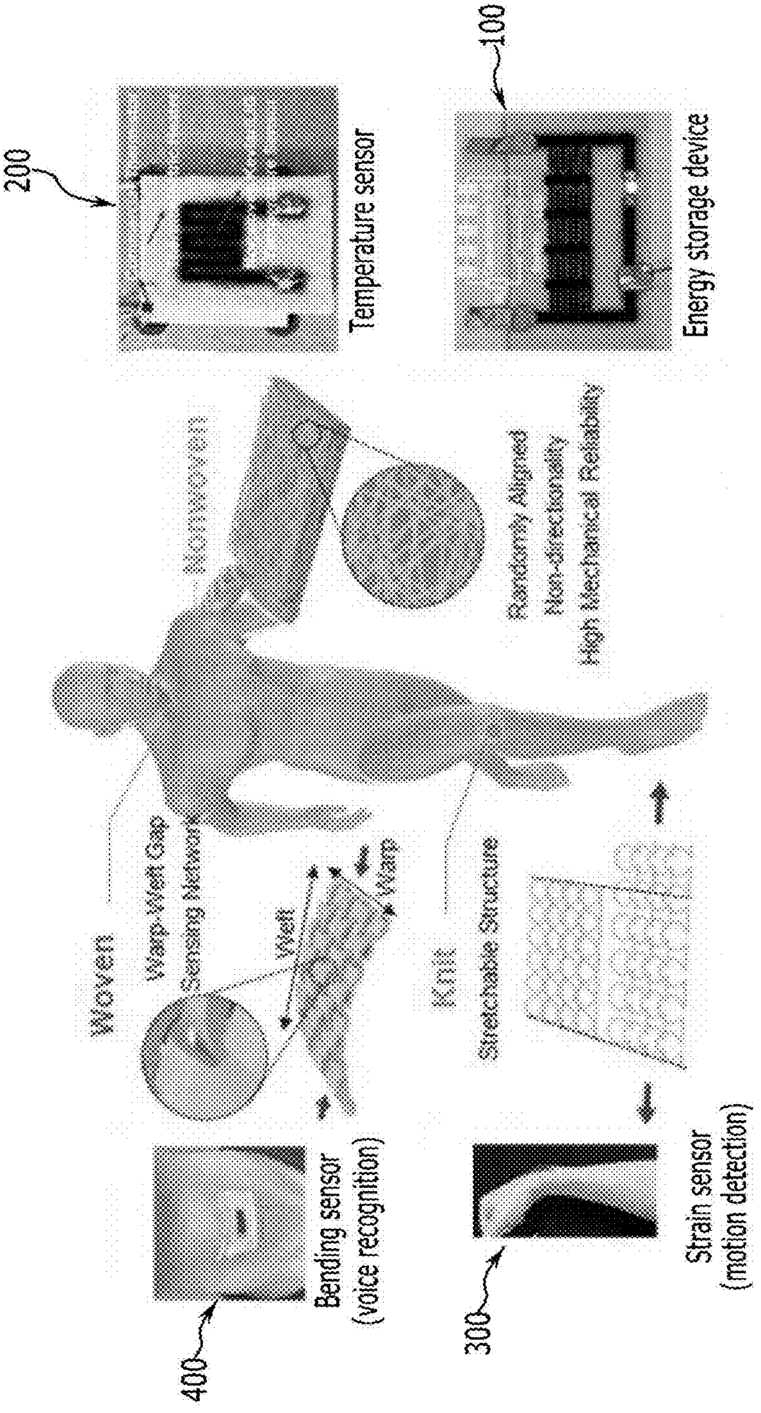
FIG. 5 is a view for explaining applications of electronic textiles according to one embodiment.

FIG. 3 is a view for explaining various fabric structures, FIG. 4 is a view illustrating a result of analyzing properties of laser-induced graphene implemented in fabrics according to one embodiment, and FIG. 5 is a view for explaining applications of electronic textiles according to one embodiment.

Referring to FIG. 3, the fabrics may be classified into non-woven fabrics, knit fabrics, and woven fabrics depending on manufacturing processes. The woven fabric is produced by weaving weft and warp at right angles in a loop. The non-woven fabric is produced by joining threads through heat, pressure, or chemical treatment. The knit fabric is produced by weaving loops of yarn by means of a knitting machine.

The electronic textiles having high flexibility, adaptability, and air permeability of the fabric may be manufactured by patterning the LIG on the fabric having various structures. The electronic textile may be applied to various wearable devices in accordance with inherent physical properties of the fabric structures.

It can be ascertained that 3D porous structures are induced in the fabric with reference to SEM images of LIG formed on the non-woven fabric, the knit fabric, and the woven fabric.

Referring to FIG. 4, the properties of LIG patterned on the Kevlar fabric may be analyzed by (a) Fourier transform infrared spectroscopy (FT-IR), (b) Raman spectroscopy, and (c) X-ray diffraction (XRD).

The FT-IR analysis result (a) may show that Kevlar is converted into LIG by breaking covalent bonds such as N—H and C═O.

The Raman spectroscopy analysis result (b) shows that LIG has three main Raman peaks at 1365, 1586, and 2710 $cm^{-1}$ corresponding to D, G, and 2D bands, unlike Kevlar having a series of pointy peaks. The G peak is induced by a center of the Brillouin zone. The D peak is generated at a sp2 carbon ring that requires an active defect. The 2D peak indicates the presence of monolayer graphene or few-layered graphene.

The XRD analysis result (c) shows that an XRD pattern of Kevlar has three peaks at $2\theta=20.42°$, 22.63°, and 28.47°, whereas an XRD pattern of LIG has peaks of $2\theta=25.9°$ (002) and 42.9° (100). This indicates that a graphene structure with an interlayer interval of 0.3 to 0.4 nm is formed.

Referring to FIG. 5, the non-woven fabric is the most basic type of fabric and includes threads randomly aligned by mechanical pressure or the like, such that the mechanical strength is high, and the flexibility (stretchability) is lowest. As described above, because the non-woven fabric has physical properties less sensitive to external strain because of high mechanical strength and an intertwined structure, the electronic textile made of the non-woven fabric may be used in application fields irrelevant to mechanical strain, e.g., used as an energy storage device 100, which includes a super capacitor, or a temperature sensor 200. According to experimental results, the super capacitor provides specific areal capacitance of 36.17 $mF/cm^2$, thermal coefficient of resistance (TCR) of the temperature sensor is measured as −0.097%/° C. at 5 to 100° C. This performance indicator may, of course, be further improved naturally.

The knit fabric is made of anisotropically intersecting yarn loops and has intrinsic flexibility because of the woven fabric structure such as a mechanical spring. Because the knit fabric has the flexible structure (stretchable structure) as described above, a strain sensor 300 capable of being used for a human body motion detection sensor or the like may be made of an electronic textile manufactured by using a knit fabric. According to an experimental result, a gauge factor (GF), which indicates the sensitivity of the strain sensor, is measured to reach 117.9 at a strain level of 0 to 3%. This performance indicator may be further improved naturally. In this case, in order to achieve high-resolution patterning and increase a measurable strain range, a motorized stage may be used first to stretch the knit fabric to a predetermined degree, and then the femtosecond laser may be used to pattern the LIG.

The woven fabric is made by interweaving weft and warp and has characteristics of forming a space (gap) made as the warp and the weft are separated when the strain is applied. Therefore, the woven fabric may create a bending detection network/a pressure detection network by the woven structure including weft and warp. Therefore, a bending sensor 400 capable of being used as a voice recognition sensor may be made of an electronic textile manufactured by using a woven fabric. According to an experimental result, a gauge factor of the bending sensor is measured as 230 at a strain level of 0 to 0.5%. This performance indicator may be further improved naturally. The bending sensor may detect small-amplitude voice vibration by means of the woven structure and distinguish between voices with high sensitivity.

As described above, the femtosecond laser may easily, conveniently, and freely pattern the graphene with high resolution on the fabrics having various structures with minimum machining. Therefore, wearable energy storage devices and various types of wearable sensors capable of performing temperature monitoring, motion detection, voice recognition, and the like may be made of an electronic textile, which may realize a wearable multimodal electronic textile.

Figure 6:
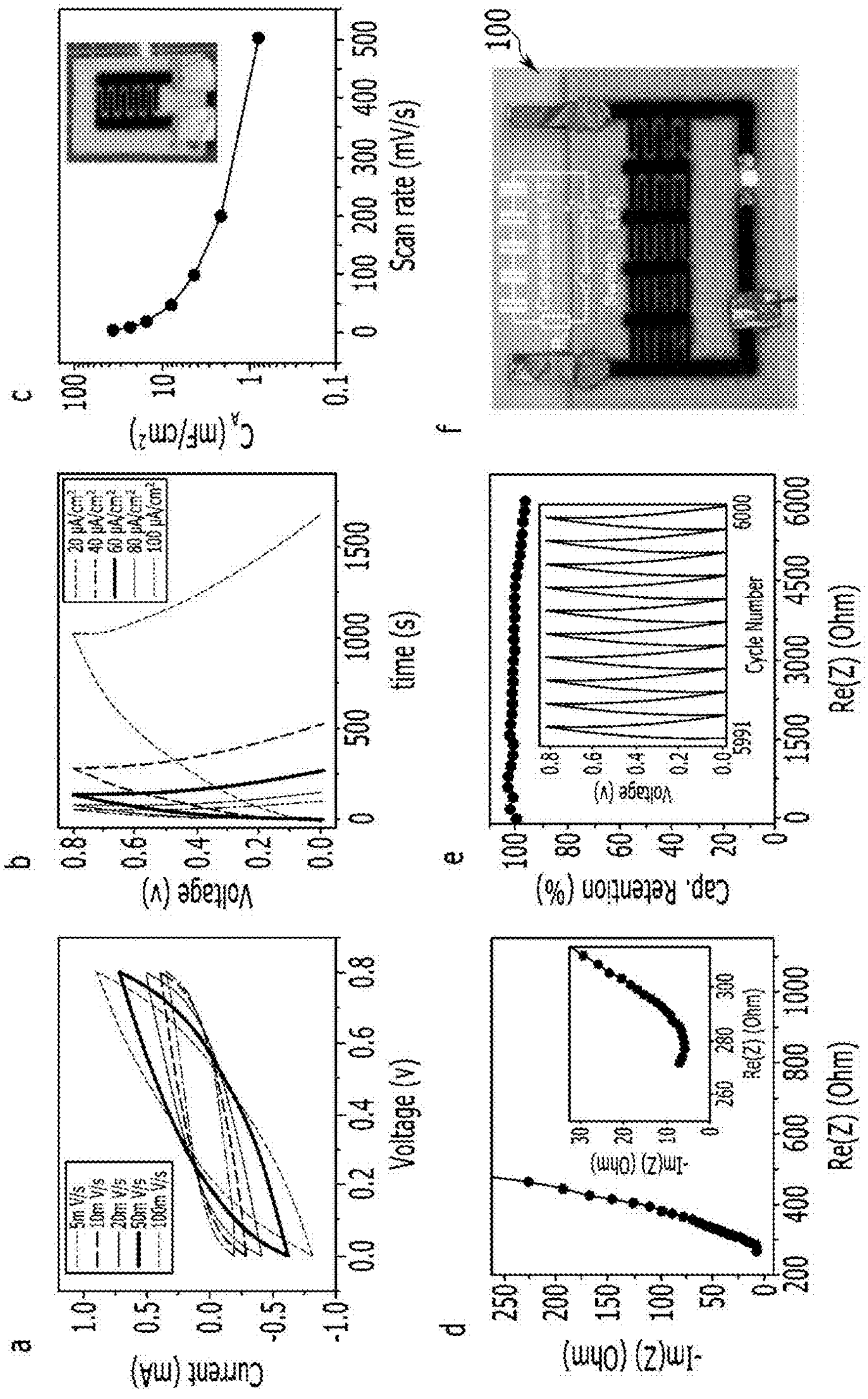
FIG. 6 is a view illustrating performance of a non-woven electronic textile-based energy storage device according to one embodiment.
Figure 7:
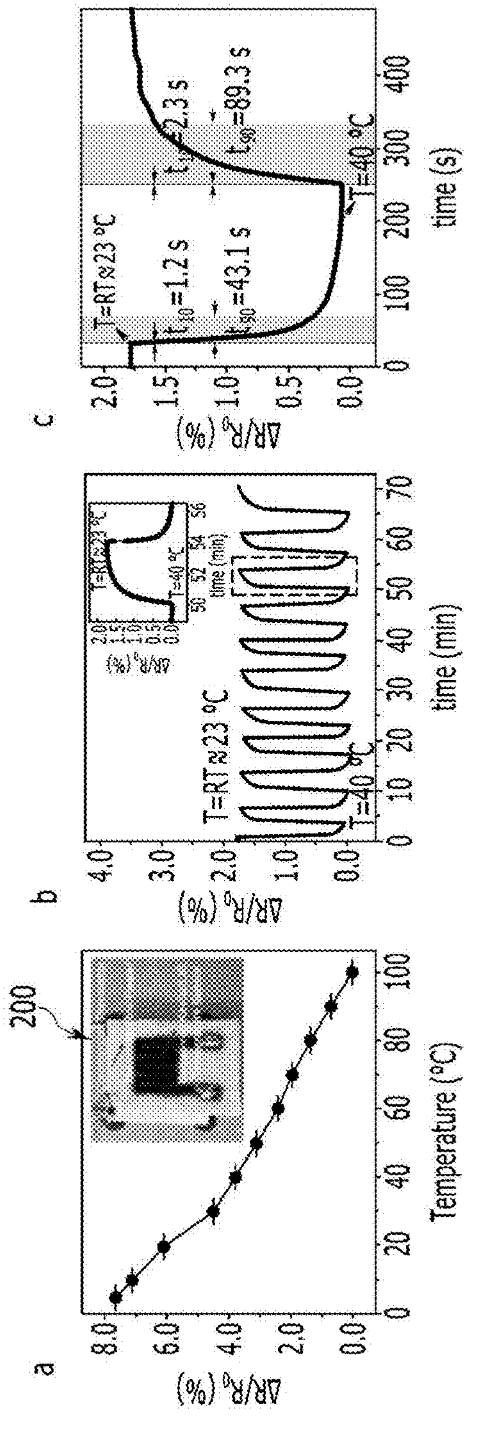
FIG. 7 is a view illustrating performance of a non-woven electronic textile-based temperature sensor according to one embodiment.

FIG. 6 is a view illustrating performance of a non-woven electronic textile-based energy storage device according to one embodiment, and FIG. 7 is a view illustrating performance of a non-woven electronic textile-based temperature sensor according to one embodiment.

Referring to FIG. 6, the super capacitor-based energy storage device 100 may be manufactured by patterning the LIG on a non-woven fabric having a mechanically stable structure. Various graphene patterns may be provided for the energy storage device 100, and the graphene pattern may be manufactured as a graphene pattern in which a plurality of super capacitors is connected in series. Because the LIG patterned on the non-woven fabric has a three-dimensional porous structure and excellent electrical conductivity, it is possible to manufacture the super capacitor, which supplies a voltage to a wearable device, by using a polyvinyl alcohol (PVA) and $H_3PO_4$ gel electrolyte.

The electrical characteristics of the super capacitor may be identified by cyclic voltammetry (CV) and galvanostatic charge-discharge (GCD) cycles. The super capacitor may be manufactured under various conditions. For example, the super capacitor may be manufactured by an infrared femtosecond laser pulse with power of 1.5 W.

(a) of FIG. 6 indicates an experimental result of the cyclic voltammetry (CV) on the super capacitor, and the experimental result indicates a quasi-rectangular curve at a wide-range scanning speed (5 to 500 mV/s), which indicates an operation of the capacitor.

(b) of FIG. 6 indicates an experimental result of galvanostatic charge-discharge (GCD) on the super capacitor, and the experimental result indicates a quasi-triangular curve at different electric current densities (20 to 100 $\mu A/cm^2$), which indicates the operation of the capacitor.

(c) of FIG. 6 indicates specific areal capacitance of the super capacitor, and it can be ascertained that specific areal capacitance of 36.17 $mF/cm^2$ may be provided.

(d) of FIG. 6 indicates a Nyquist plot for calculating electrochemical resistance and indicates an operation of the capacitor that shows a nearly vertical gradient in a low-frequency region. The insert picture shows that equivalent series resistance (ESR), which indicates resistance of an electrode, an electrolyte, and charge transfer, is measured as 288Ω.

(e) of FIG. 6 indicates an experimental result related to capacitance retention over 6,000 cycles, and it can be ascertained that 96.3% of initial capacitance is maintained after 6,000 cycles while a stable charge/discharge triangular shape is maintained.

(f) of FIG. 6 indicates an energy storage device constructed by five LIG super capacitors connected in series, it can be ascertained that when a switch is connected, power is supplied to a light-emitting diode (LED).

Referring to FIG. 7, the temperature sensor 200 may be manufactured by patterning the LIG on the non-woven fabric having the mechanically stable structure. Various graphene patterns may be provided for the temperature sensor 200.

(a) of FIG. 7 indicates a temperature resistance curve of the temperature sensor, and the temperature resistance curve may be obtained by gradually increasing the temperature within a range of 5 to 100° C. and measuring average electrical resistance for each temperature section. A resistance-temperature coefficient (TCR) is −0.097%/° C. that is a negative value. The TCR of the non-woven fabric Kevlar/LIG temperature sensor may be compared with a cutting-edge graphene-based temperature sensor such as LIG (0.08%/° C.) of a leaf, LIG (−0.1%/° C.) of polyimide (PI), LIG (−0.028%/° C.) of paper, and graphene (−0.0017%/° C.) in a CVD process.

(b) and (c) of FIG. 7 indicate the response and recovery time of the temperature sensor by repeatedly adjusting the temperature between the room temperature and a high temperature of 40° C. The response and recovery time are respectively 43.1 seconds and 89.3 seconds that are at a sufficiently excellent level in a medical application field. The response and recovery time of the temperature sensor may be determined by a Kevlar thickness (5 mm), an interval between a Pt thermistor and the Kevlar, and thermal conductivity (0.04 W/mK) of the Kevlar.

Figure 8:
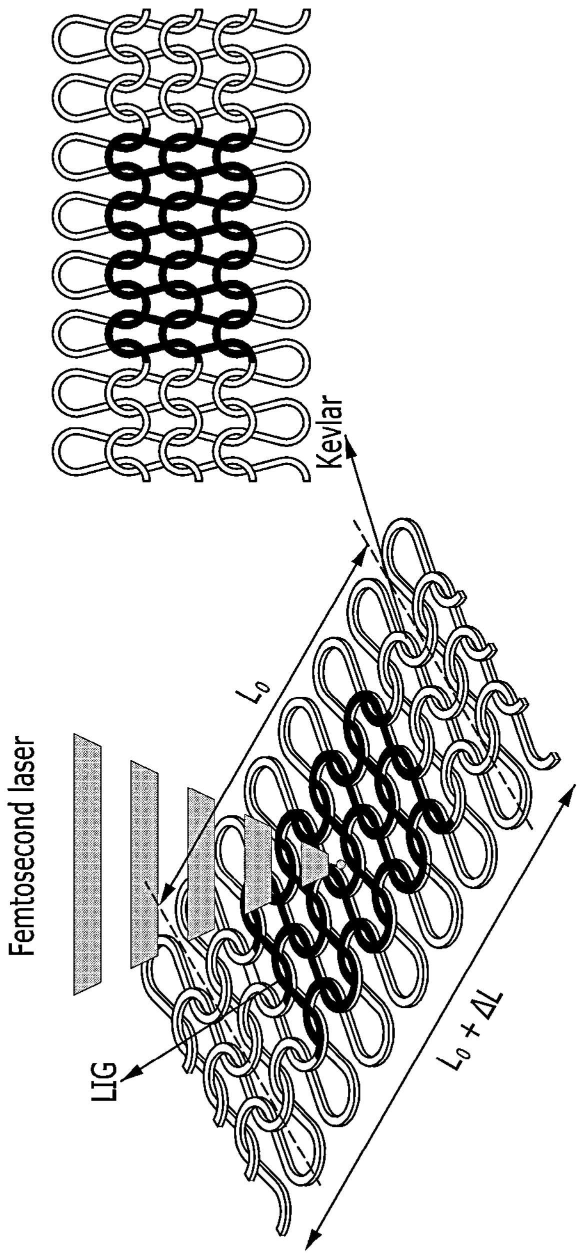
FIG. 8 is a view for explaining a method of manufacturing a knitted electronic textile according to one embodiment.
Figure 9:
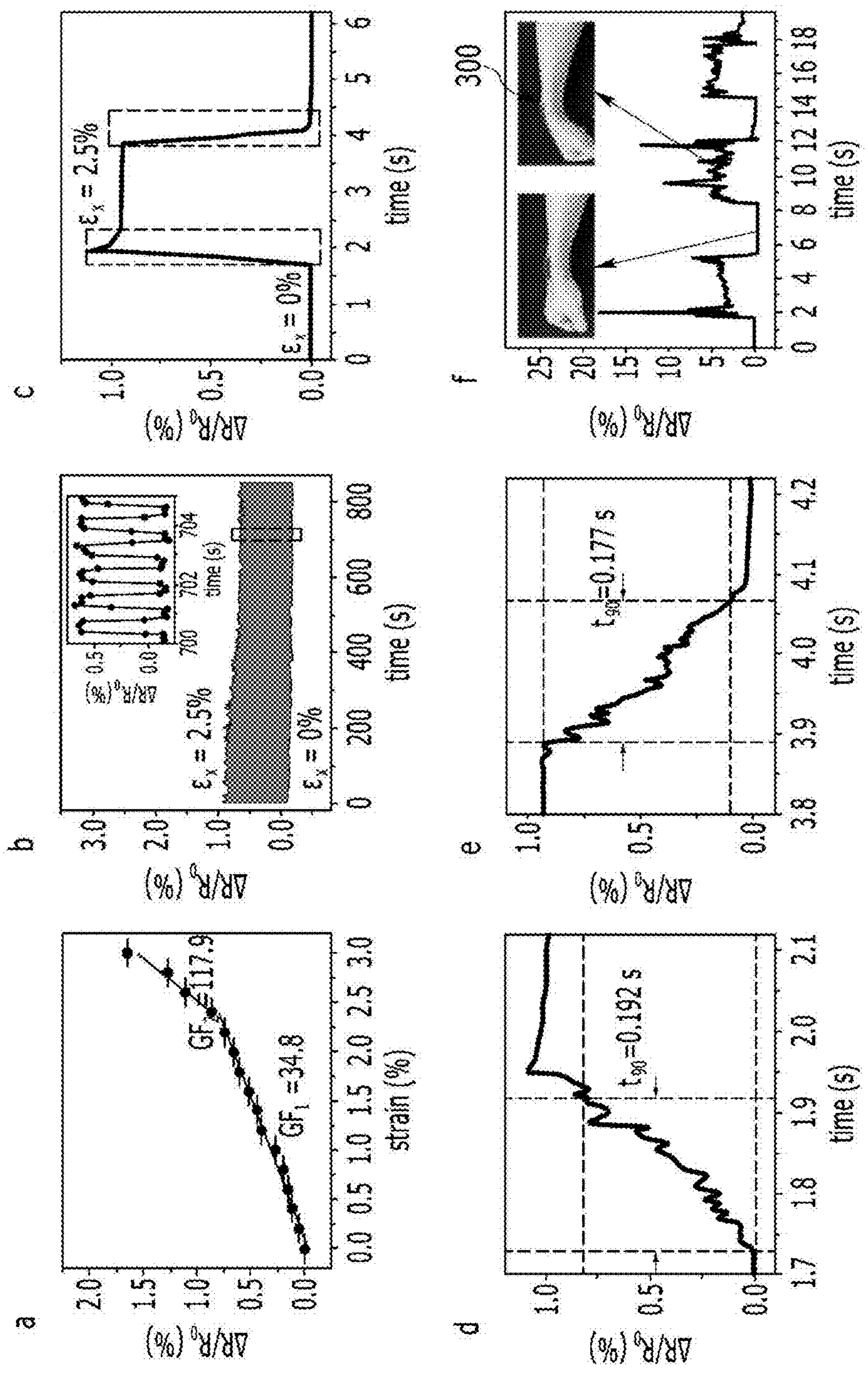
FIG. 9 is a view illustrating performance of a knitted electronic textile-based strain sensor according to one embodiment.

FIG. 8 is a view for explaining a method of manufacturing a knitted electronic textile according to one embodiment, and FIG. 9 is a view illustrating performance of a knitted electronic textile-based strain sensor according to one embodiment.

Referring to FIGS. 8 and 9, the strain sensor 300 may be manufactured by patterning the LIG on the knit fabric having the flexible structure. The strain sensor 300 may be used as a human body motion detection sensor. The strain sensor may be easily embedded in the knit fabric because of the intrinsic flexibility of the knit fabric and microcracks of the LIG. The microcrack-based strain sensor has a large gauge factor (GF), fast response time, and high reliability in comparison with other types of strain sensors. In addition, the contact resistance of the knit fabric structure defined by Equation 1 also affects the change in resistance. The high-sensitivity strain sensor may be manufactured by patterning the microcrack LIG on the knit fabric Kevlar.

$$R_c=\rho 2\pi HNP \quad \text{(Equation 1)}$$

In Expression 1, Rc represents contact resistance, ρ represents electrical resistance, H represents material hardness, N represents contact area, and P represents contact pressure between conductive yarn.

In order to achieve high-resolution patterning and increase a measurable strain range, a motorized stage may be used first to perform pre-strain (Lo+ΔL) for stretching the knit fabric within a predetermined range (e.g., 10%), and the femtosecond laser may be used to pattern the LIG in accordance with a rectangular shape (5×15 mm). For example, the LIG may be patterned by a UV femtosecond laser with an average output of 500 meanwhile and a beam scanning speed of 20 mm/s.

(a) of FIG. 9 is a strain-resistance graph (strain-resistance curve) showing a change in resistance calculated in accordance with an increase in strain from 0 to 3.0%. The strain-resistance graph shows a gauge factor (GF), which indicates the sensitivity of the strain sensor, and two linear regions of 34.8 and 117.9. These distinct regions are based on a combination of microcracks and contact resistance.

(b) of FIG. 9 illustrates a result of testing the reliability of the strain sensor, i.e., a result evaluated at strain of 2.5%. A load-unload test was performed for 1,000 cycles, and it can be ascertained that a state is slowly converged to a stable normal state.

(c) to (e) of FIG. 9 illustrate the time response of the strain sensor measured at different strain rates. The result is a result evaluated at strain within a range of 0 to 2.5%. A rapid strain rate change of 2.5% at a tension rate of 10 mm/s was measured on a time scale of 1.0 ms. The response and recovery times of the strain sensor are respectively 0.192 seconds and 0.177 seconds.

Referring to (f) of FIG. 9, according to a result of measuring a change in resistance in accordance with a motion of a wrist to which the strain sensor is attached, it can be ascertained that the strain sensor detects an operation of the wrist.

Figure 10:
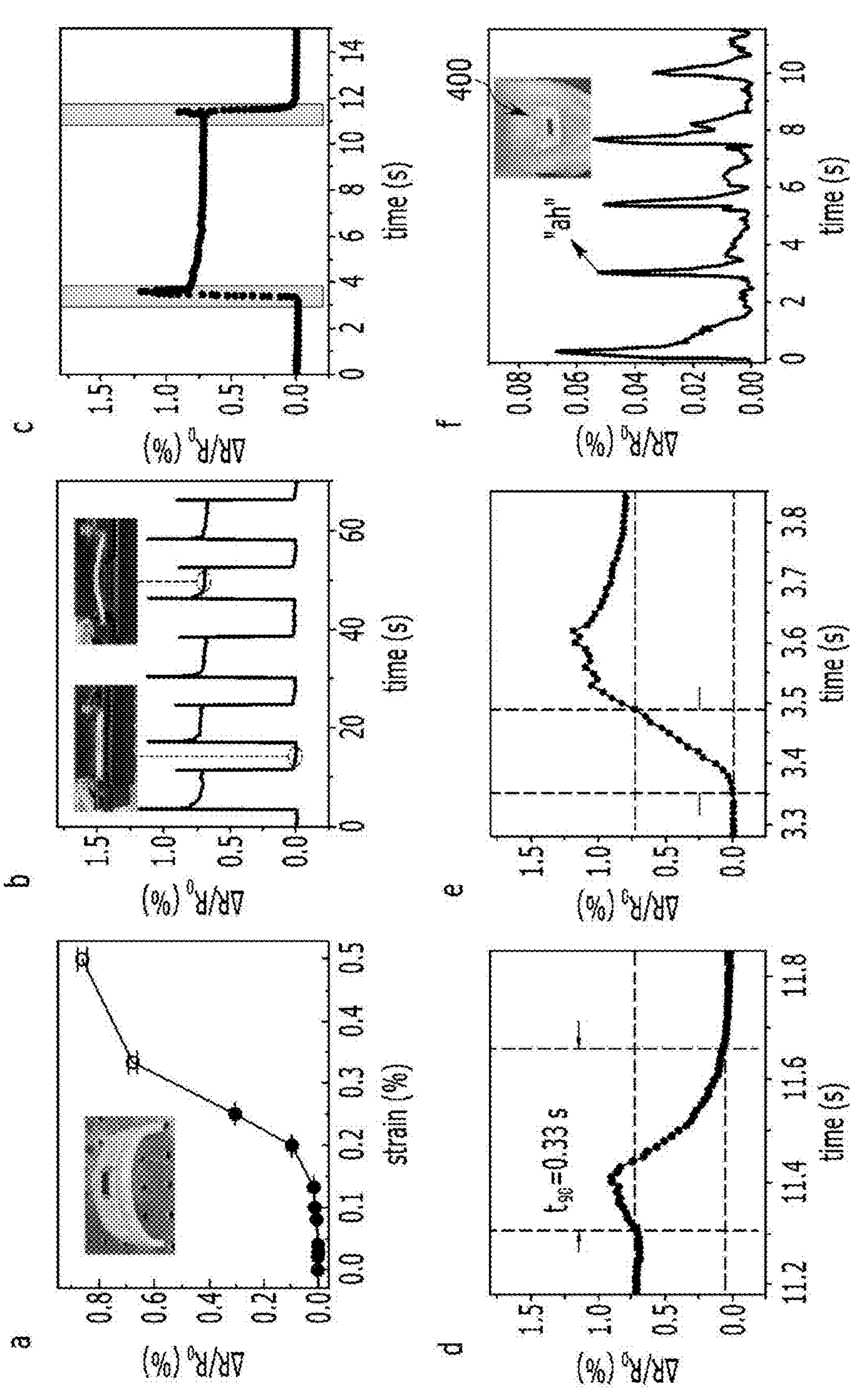
FIG. 10 is a view illustrating performance of a woven electronic textile-based bending sensor according to one embodiment.

FIG. 10 is a view illustrating performance of a woven electronic textile-based bending sensor according to one embodiment.

Referring to FIG. 10, the bending sensor 400 may be manufactured by patterning the LIG on a woven fabric having a woven structure including weft and warp. The high-sensitivity bending sensor may be manufactured by a detection network of the woven fabric and microcracks of the LIG.

(a) of FIG. 10 is a strain-resistance graph of the bending sensor, and it can be ascertained that a gauge factor of the bending sensor is measured as 230 at a strain level of 0 to 0.5%.

(b) of FIG. 10 indicates a result of testing the reliability of the bending sensor, and a load-unload test was performed for 5 cycles by using a motorized stage.

(c) to (e) of FIG. 10 indicate the time response of the bending sensor, and the response time and the recovery time were respectively measured as 0.14 seconds and 0.33 seconds, and an ascending edge and a descending edge were respectively measured as 6.85 seconds and −3.32 seconds.

(f) FIG. 10 indicates a voice recognition result monitored by the bending sensor attached to a neck. It can be ascertained that the bending sensor may detect small-amplitude voice vibration by means of the woven structure and clearly distinguish and express 'Aha' sounds repeated with high sensitivity.

Figure 11:
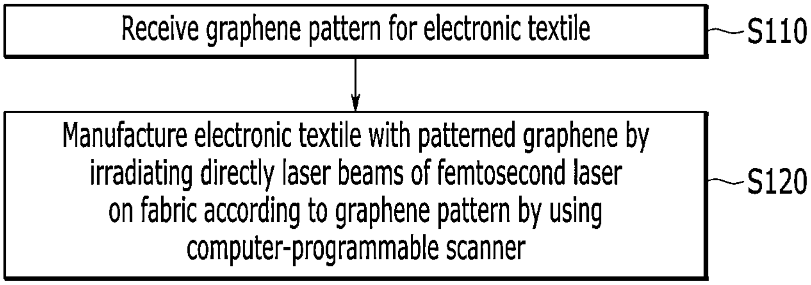
FIG. 11 is a flowchart for explaining a method of manufacturing a laser-induced graphene-based electronic textile according to one embodiment.

FIG. 11 is a flowchart for explaining a method of manufacturing a laser-induced graphene-based electronic textile according to one embodiment.

Referring to FIG. 11, the laser system 10 receives the graphene pattern for the electronic textile (S110). The graphene pattern may be designed to have various shapes, and the size and shape may vary depending on the type of electronic textile.

The laser system 10 manufactures the electronic textile with patterned graphene by irradiating directly laser beams of a femtosecond laser 11 on the fabric according to a graphene pattern by using a computer-programmable scanner 12 (S120). The electronic textile may be created by patterning the LIG on the fabric having the fabric structure suitable for the applications. The femtosecond laser 11 may be a laser that outputs ultrashort femtosecond pulses with a high repetition rate. The super capacitor-based energy storage device 100 may be manufactured by patterning the LIG on the non-woven fabric having the mechanically stable structure. The temperature sensor 200 may be manufactured by patterning the LIG on the non-woven fabric having the mechanically stable structure. The temperature sensor 200 may monitor the temperature by means of the change in resistance. The strain sensor 300 may be manufactured by patterning the LIG on the knit fabric having the flexible structure. The strain sensor 300 may detect length strain by means of the flexible structure and thus be used as a motion detection sensor.

The bending sensor 400 may be manufactured by patterning the LIG on a woven fabric having a woven structure including weft and warp. The bending sensor 400 may detect small-amplitude voice vibration by means of the woven structure and thus be used as a voice recognition sensor.

As described above, according to the embodiment, it is possible to manufacture the laser-induced graphene-based electronic textile with high patterning resolution and a minimum machining depth in various fabric structures.

According to the embodiment, it is possible to manufacture the laser-induced graphene-based electronic textile that may be easily applied to general fabrics without requiring a fabric weaving process and have high electrical conductivity without a problem of potential degradation.

According to the embodiment, the wearable energy storage devices and various types of wearable sensors capable of performing temperature monitoring, motion detection, voice recognition, and the like may be made of the electronic textile, which may realize the wearable multimodal electronic textile.

The above-mentioned exemplary embodiments of the present disclosure are not implemented only by the device and the method. The exemplary embodiments of the present disclosure may be implemented by programs for realizing functions corresponding to the configuration of the exemplary embodiment of the present invention or recording media on which the programs are recorded.

Although the embodiments of the present disclosure have been described in detail above, the right scope of the present disclosure is not limited thereto, and it should be construed that many variations and modifications made by those skilled in the art using the basic concept of the present disclosure, which is defined in the following claims, will also belong to the right scope of the present disclosure.

What is claimed is:

1. A laser system comprising:

a femtosecond laser configured to output femtosecond laser beams; and a scanner configured to irradiate the femtosecond laser beams outputted from the femtosecond laser directly on fabric, according to a graphene pattern, to convert a material of the fabric into graphene, wherein an electronic textile with the graphene patterned on the fabric is manufactured by the femtosecond laser beams.

2. The laser system of claim 1, wherein the graphene pattern and a structure of the fabric are differently determined depending on applications of the electronic textile.

3. The laser system of claim 2, wherein the fabric is a non-woven fabric when the application of the electronic textile is an energy storage device.

4. The laser system of claim 2, wherein the fabric is a non-woven fabric when the application of the electronic textile is a temperature sensor.

5. The laser system of claim 2, wherein the fabric is a knit fabric when the application of the electronic textile is a strain sensor.

6. The laser system of claim 5, wherein the graphene is patterned on the knit fabric in a pre-strain state in which the knit fabric is stretched within a predetermined range.

7. The laser system of claim 2, wherein the fabric is a woven fabric when the application of the electronic textile is a bending sensor.

8. The laser system of claim 7, wherein the bending sensor is used as a voice recognition sensor that distinguishes between voices by detecting voice vibration by means of a woven structure including weft and warp of the woven fabric.

9. The laser system of claim 1, wherein the femtosecond laser is configured to output the femtosecond laser beams for causing the fabric to absorb photons to accumulate heat that occurs recrystallization, carbonization, and graphitization in the fabric.

10. A method of manufacturing a laser-induced graphene-based electronic textile, the method comprising:

receiving a graphene pattern; and manufacturing an electronic textile with patterned graphene by irradiating femtosecond laser beams of a femtosecond laser directly on a fabric according to a graphene pattern by using a computer-programmable scanner to convert a material of the fabric into the patterned graphene.

11. The method of claim 10, wherein the graphene pattern and a structure of the fabric are differently determined depending on applications of the electronic textile.

12. The method of claim 11, wherein the manufacturing the electronic textile comprises manufacturing an energy storage device by irradiating directly the laser beams on a non-woven fabric when the application of the electronic textile is the energy storage device.

13. The method of claim 11, wherein the manufacturing the electronic textile comprises manufacturing a temperature sensor by irradiating directly the laser beams on a non-woven fabric when the application of the electronic textile is the temperature sensor.

14. The method of claim 11, wherein the manufacturing the electronic textile comprises manufacturing a strain sensor by irradiating directly the laser beams on a knit fabric when the application of the electronic textile is the strain sensor.

15. The method of claim 14, wherein the manufacturing the electronic textile comprises patterning graphene by irradiating directly the laser beams on the knit fabric in a pre-strain state in which the knit fabric is stretched within a predetermined range.

16. The method of claim 11, wherein the manufacturing the electronic textile comprises manufacturing a bending sensor by irradiating directly the laser beams on a woven fabric when the application of the electronic textile is the bending sensor.

17. The method of claim 16, wherein the bending sensor is used as a voice recognition sensor that distinguishes between voices by detecting voice vibration by means of a woven structure including weft and warp of the woven fabric.

18. The method of claim 10, further comprising outputting the femtosecond laser beams for causing the fabric to absorb photons to accumulate heat that occurs recrystallization, carbonization, and graphitization in the fabric.

* * * * *